(12) United States Patent
Chen et al.

(10) Patent No.: US 8,741,111 B2
(45) Date of Patent: Jun. 3, 2014

(54) COATED ARTICLE AND METHOD FOR MAKING SAID ARTICLE

(75) Inventors: Wen-Rong Chen, New Taipei (TW); Huann-Wu Chiang, New Taipei (TW); Cheng-Shi Chen, New Taipei (TW); Cong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 262 days.

(21) Appl. No.: 13/247,035

(22) Filed: Sep. 28, 2011

(65) Prior Publication Data
US 2013/0040119 A1    Feb. 14, 2013

(30) Foreign Application Priority Data
Aug. 10, 2011   (CN) .......................... 2011 1 0228396

(51) Int. Cl.
*B32B 15/04* (2006.01)
*B05D 1/36* (2006.01)
*B32B 7/02* (2006.01)

(52) U.S. Cl.
USPC .................................. 204/192.15; 427/419.7

(58) Field of Classification Search
None
See application file for complete search history.

(56) References Cited

FOREIGN PATENT DOCUMENTS

CN            101214744 A   *   7/2008   ............... B32B 7/02

\* cited by examiner

*Primary Examiner* — David Sample
*Assistant Examiner* — Nicole T Gugliotta
(74) *Attorney, Agent, or Firm* — Novak Druce Connolly Bove + Quigg LLP

(57) ABSTRACT

A coated article includes a substrate, and a plurality of aluminum nitride layers and a plurality of titanium boride layers formed on the substrate. Each aluminum nitride layer interleaves with one titanium boride layer. One of the aluminum nitride layers is directly formed on the substrate. A method for making the coated article is also described.

8 Claims, 2 Drawing Sheets

COATED ARTICLE AND METHOD FOR MAKING SAID ARTICLE

BACKGROUND

1. Technical Field

The present disclosure relates to coated articles and a method for making the coated articles.

2. Description of Related Art

Nitrides, carbides and carbonitrides of transition metals are usually coated on cutting tools or molds due to their high hardness, high wear resistance and good chemical stability. However, the layers coated on the cutting tools or the molds are also required to have good high temperature oxidation resistance.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
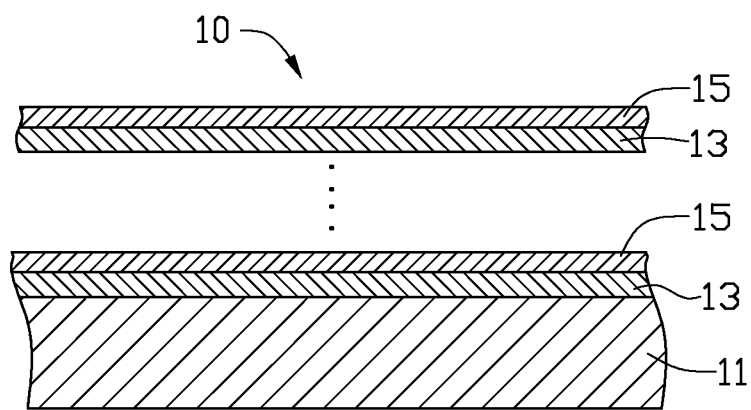
FIG. 1 is a cross-sectional view of an exemplary coated article.

FIG. 1 shows a coated article 10 according to an exemplary embodiment. The coated article 10 includes a substrate 11, and a plurality of aluminum nitride (AlN) layers 13 and a plurality of titanium boride (TiB$_2$) layers 15 formed on the substrate 11. Each aluminum nitride layer 13 alternates/interleaves with one corresponding titanium boride layer 15. One of the aluminum nitride layers 13 is directly formed on the substrate 11. Furthermore, one of the titanium boride layers 15 forms the outermost layer of the coated article 10. The total thickness of the aluminum nitride layers 13 and the titanium boride layers 15 may be about 1.0 μm to about 2.5 μm. The total number of the aluminum nitride layers 13 may be about 80 layers to about 100 layers. The total number of the titanium boride layers 15 is equal to the number of aluminum nitride layers 13.

The substrate 11 is made of metal or ceramic, and cutting tool or mold made by metal or ceramic is preferred.

A vacuum sputtering process may be used to form the aluminum nitride layers 13 and the titanium boride layers 15. Each aluminum nitride layer 13 may have a thickness of about 3 nm-8 nm. Each titanium boride layer 15 may have a thickness of about 3 nm-8 nm.

Figure 2:
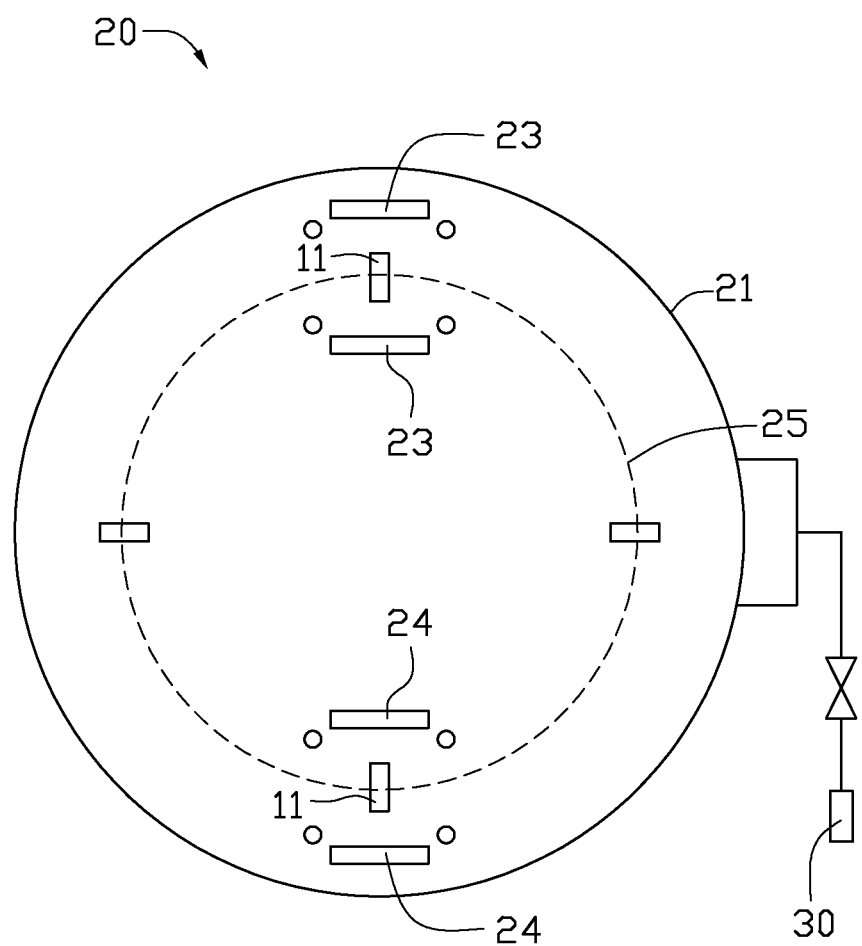
FIG. 2 is a schematic view of a vacuum sputtering device for fabricating the coated article in FIG. 1.

FIG. 2 shows a vacuum sputtering device 20, which includes a vacuum chamber 21 and a vacuum pump 30 connected to the vacuum chamber 21. The vacuum pump 30 evacuates the vacuum chamber 21. The vacuum chamber 21 has aluminum targets 23, titanium boride targets 24 and a rotary rack (not shown) positioned therein. The rotary rack holding the substrate 11 revolves along a circular path 25, and the substrate 11 is also rotated about its own axis while being carried by the rotary rack.

A method for making the coated article 10 may include the following steps:

The substrate 11 is pretreated. The pre-treating process may include wiping the surface of the substrate 11 with alcohol and deionized water, to remove impurities such as grease or dirt from the substrate 11. Then, the substrate 11 is dried.

One of the aluminum nitride layers 13 may be vacuum sputtered on the substrate 11. Vacuum sputtering of the aluminum nitride layers 13 is carried out in the vacuum chamber 21. The substrate 11 is positioned on the rotary rack. The vacuum chamber 21 is evacuated to about $8.0 \times 10^{-3}$ Pa and is heated to a temperature of about 150° C. to about 200° C. Ar is used as the sputtering gas and is fed into the vacuum chamber 21 at a flow rate of about 300 sccm to about 450 sccm. Nitrogen is used as the reaction gas and is fed into the vacuum chamber 21 at a flow rate of about 120 sccm to about 200 sccm. The aluminum targets 23 are supplied with electrical power of about 8 kw to about 10 kw. A negative bias voltage of about −150 V to about −250 V is applied to the substrate 11. Deposition of the aluminum nitride layer 13 takes about 0.5 min to about 1.5 min.

One of the titanium boride layers 15 is vacuum sputtered on the aluminum nitride layer 13. Vacuum sputtering of the titanium boride layers 15 is carried out in the vacuum chamber 21. Aluminum targets 23 are powered off and titanium boride targets 24 are supplied with electrical power of about 5 kw to about 8 kw. The flow rate of Ar, temperature of the vacuum chamber 21 and the negative bias voltage are the same as vacuum sputtering of the aluminum nitride layer 13. Deposition of the titanium boride layer 15 takes about 1.0 min to about 1.5 min.

The steps of magnetron sputtering the aluminum nitride layer 13 and the titanium boride layers 15 are alternatingly repeated an equal number of times ranging from about 80-100 times to form the coated article 10.

Example 1

The vacuum sputtering device 20 in example 1 was a medium frequency magnetron sputtering device.

The substrate 11 was made of die steel.

Sputtering to form the aluminum nitride layer 13 on the substrate 11 took place, wherein the vacuum chamber 21 was heated to a temperature of about 200° C. Ar was fed into the vacuum chamber 21 at a flow rate of about 300 sccm. N$_2$ was fed into the vacuum chamber 21 at a flow rate of about 120 sccm. The aluminum targets 23 were supplied with a power of about 8 kw, and a negative bias voltage of about −150 V was applied to the substrate 11. Deposition of the aluminum nitride layer 13 took about 0.5 min. The aluminum nitride layer 13 had a thickness of about 4 nm.

Sputtering to form the titanium boride layers 15 on the aluminum nitride layer 13 took place, wherein the titanium boride targets 24 were supplied with a power of about 5 kw. Other conditions were substantially the same as vacuum sputtering of the aluminum nitride layer 13. The deposition of the titanium boride layers 15 took about 1.0 min. The titanium boride layers 15 had a thickness of about 5 nm.

The step of sputtering the aluminum nitride layer 13 and the step of sputtering the titanium boride layers 15 were each alternatingly repeated 80 times.

Example 2

The vacuum sputtering device 20 in example 2 was the same in example 1.

The substrate 11 was made of die steel.

Sputtering to form the aluminum nitride layer 13 on the substrate 11 took place, wherein the vacuum chamber 21 was heated to a temperature of about 200° C. Ar was fed into the vacuum chamber 21 at a flow rate of about 300 sccm. $N_2$ was fed into the vacuum chamber 21 at a flow rate of about 120 sccm. The aluminum targets 23 were supplied with a power of about 10 kw, and a negative bias voltage of about −150 V was applied to the substrate 11. Deposition of the aluminum nitride layer 13 took about 1.0 min. The aluminum nitride layer 13 had a thickness of about 8 nm.

Sputtering to form the titanium boride layers 15 on the aluminum nitride layer 13 took place, wherein the titanium boride targets 24 were supplied with a power of about 8 kw. Other conditions were substantially the same as vacuum sputtering of the aluminum nitride layer 13. The deposition of the titanium boride layers 15 took about 1.5 min. The titanium boride layers 15 had a thickness of about 8 nm.

The step of sputtering the aluminum nitride layer 13 and the step of sputtering the titanium boride layers 15 were each alternatingly repeated 80 times.

The coated article 10 includes a plurality of alternating aluminum nitride layers 13 and titanium boride layers 15 formed on the substrate, which produces strong interface effect and interlayer coupling, and make the coated article 10 has special properties different from single-layer coatings. Aluminum nitride may be oxidized to aluminum oxide at high temperature, the formation of aluminum oxide may protect the coated layers from further oxidation. Furthermore, the titanium boride itself also has a better oxidation resistance. Thus, the coated article has good high temperature oxidation resistance, and may withstand temperature up to 900° C.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A method for making a coated article, comprising:
   providing a substrate;
   forming an aluminum nitride layer on the substrate, magnetron sputtering the aluminum nitride layer using argon gas as the sputtering gas and the argon gas having a flow rate of about 300 sccm to about 450 sccm; using nitrogen as the reaction gas and nitrogen having a flow rate of about 120 sccm to about 200 sccm; magnetron sputtering the aluminum nitride layer being carried out at a temperature of about 150° C. to about 200° C.; using aluminum targets and the aluminum targets being supplied with a power of about 8 kw to about 10 kw; a negative bias voltage of about −150 V to about −500 V being applied to the substrate;
   forming a titanium boride layer on the aluminum nitride layer; and
   repeating the steps of alternatingly forming the aluminum nitride layer and the titanium boride layer to form the coated article, and the outermost layer of the coated article being one of the titanium boride layers.

2. The method as claimed in claim 1, wherein vacuum sputtering the aluminum nitride layer takes about 0.5 min to about 1.5 min.

3. The method as claimed in claim 1, wherein magnetron sputtering the titanium boride layer uses argon gas as the sputtering gas and the argon gas has a flow rate of about 300 sccm to about 450 sccm; magnetron sputtering the titanium boride layer is carried out at a temperature of about 150° C. to about 200° C.; uses titanium boride targets and the titanium boride targets are supplied with a power of about 5 kw to about 8 kw; a negative bias voltage of about −150 V to about −250 V is applied to the substrate.

4. The method as claimed in claim 3, wherein vacuum sputtering the titanium boride layer takes about 1.0 min to about 1.5 min.

5. The method as claimed in claim 1, wherein the substrate is made of metal or ceramic.

6. The method as claimed in claim 1, wherein each aluminum nitride layer has a thickness of about 3 nm to about 8 nm.

7. The method as claimed in claim 1, wherein each titanium boride layer has a thickness of about 3 nm to about 8 nm.

8. The method as claimed in claim 1, wherein the step of repeating the forming of the aluminum nitride layer and the titanium boride layer is each carried out an equal number times ranging from about eighty times to about one hundred times.

* * * * *